(12) United States Patent
Okazawa

(10) Patent No.: US 6,477,077 B2
(45) Date of Patent: Nov. 5, 2002

(54) NON-VOLATILE MEMORY DEVICE

(75) Inventor: Takeshi Okazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/911,709

(22) Filed: Jul. 25, 2001

(65) Prior Publication Data
US 2002/0012267 A1 Jan. 31, 2002

(30) Foreign Application Priority Data
Jul. 28, 2000 (JP) ........................................ 2000-228971

(51) Int. Cl.$^7$ ................................................ G11C 11/22
(52) U.S. Cl. ........................ 365/145; 365/158; 365/171; 365/185.18
(58) Field of Search ................................ 365/145, 158, 365/171, 173, 185.18

(56) References Cited

U.S. PATENT DOCUMENTS

| 5,793,697 A | * | 8/1998 | Scheuerlein | ................. 365/171 |
| 5,838,608 A | | 11/1998 | Zhu et al. | |
| 5,991,193 A | | 11/1999 | Gallagher et al. | |
| 6,269,018 B1 | * | 7/2001 | Monsma et al. | ............. 365/145 |
| 6,324,093 B1 | * | 11/2001 | Perner et al. | ................ 365/171 |

FOREIGN PATENT DOCUMENTS

| JP | 10-247381 | 9/1998 |
| JP | 2000-82791 | 3/2000 |

* cited by examiner

*Primary Examiner*—Son T. Dinh
(74) *Attorney, Agent, or Firm*—Sughrue Mion, PLLC

(57) ABSTRACT

A non-volatile memory device has a plurality of row lines extending in a first direction, a plurality of column lines extending in a second direction differing from the first direction, the plurality of column lines and the plurality of row lines forming a wiring matrix, a plurality of memory cells disposed at intersection points between the plurality of row lines and the plurality of column lines of the wiring matrix, each memory cell being formed by two ferromagnetic thin films and an insulation film therebetween, a wiring selection means for selecting at least one row line from the plurality of row lines and selecting at least one column line from the plurality of column lines, and a potential applying means for causing a prescribed current to flow in the selected row lines and column lines and applying to the row lines and column lines other than the selected row lines and column lines a prescribed potential which is not a ground potential.

4 Claims, 5 Drawing Sheets

WRITE OPERATION

NON-VOLATILE MEMORY DEVICE

BACKGROUND OF THE INVENTION

1. Field of the Invention

The present invention relates to an electrically rewritable non-volatile memory device, and more particularly to a non-volatile memory device in which a storage element is formed by a magnetoresistive element made of a ferromagnetic thin film.

2. Related Art

Among electrical rewritable non-volatile memory devices, a memory device in which a storage element is formed by a magnetoresistive element made of a ferromagnetic thin film is referred to as magnetic RAM or MRAM.

FIGS. 3(a) and (b) show the structure and operation of the conventional MRAM device.

As shown in FIG. 3(a), the conventional MRAM device consists of a magnetization fixing layer 12 made of an approximately 20 nm ferromagnetic film which is formed on a lower interconnect layer 11, a data storage layer 14 made of a ferromagnetic film of approximately 20 nm and an insulation layer 13 having a thickness of approximately 1.5 nm which is interposed between the magnetization fixing layer 12 and the data storage layer 14, and an upper interconnect layer 15 which is formed on the data storage layer 14.

FIG. 3(b) shows a reading operation in the memory cell shown in FIG. 3(a).

In a memory device formed by a magnetic thin film in which the direction of magnetization of the fixed layer 12 is fixed, and the direction of magnetization of the data storage layer 14 changes depending upon the stored information, a storage operation is performed by detecting a difference in the tunnel current flowing between the lower interconnect layer 11 and the upper interconnect layer 15. That is, between the conditions in which the magnetization directions of the fixed layer 12 and the data storage layer 14 are mutually parallel (corresponding to the data "0") and anti-parallel (corresponding to the data "1"), there is a change in the resistance value of the insulation film 13 of 10% to 40%, this being known as the tunnel magnetoresistive effect (TMR), which is used to perform storage. In actuality, an external magnetic field is used to change the magnetization direction of the data storage layer 14 so as to perform binary storage.

If the above-noted conditions are implemented, the readout of data can be done by applying a prescribed potential between the upper interconnect layer and the lower interconnect layer, so that a tunnel current flow from the lower interconnect layer 11 through the upper interconnect layer 15, via the fixed layer 12, the insulation layer 13 and the data storage layer 14. That is, by means of the tunnel magnetoresistive effect, the resistance value changes depending upon whether the magnetization directions of two ferromagnetic layers sandwiching an insulation layer are parallel or anti-parallel, so that the reading of the stored information is performed by detecting the current change.

The above is the so-called tunnel magnetoresistive (TMR) effect, which is simplifies the formation of lead-out electrodes for guiding data to the outside in comparison to the giant magnetoresistive (GMR) effect of the past, this being an advantage in forming a high-density MRAM.

FIG. 4(a) shows an actual MRAM, in which the memory cells shown in FIG. 3 are arranged in an array.

In this MRAM, there are a plurality of lower interconnects serving as word lines, and a plurality of upper interconnects serving as bit lines arranged in a direction different from that of the word lines. The above-noted memory cells are located at the intersection points of this matrix. An arbitrary cell in the MRAM is selected by a word line and a bit line, and the tunnel current between the word line and the bit line is detected, so as to enable the stored information to be extracted to the outside.

An example of this type of memory in the past is, for example, disclosed in Japanese Patent Publication (KOKAI) 2000-82791. In the configuration described in that publication as well, the change in the tunnel current in an MTJ (magnetic tunnel junction) element formed between a lower interconnect and an upper interconnect is detected so as to readout stored information.

In this manner, an MRAM using the TMR effect usually has a structure consisting of a magnetoresistive element with at least three layers, that is, two ferromagnetic thin films with an insulation film therebetween, the change in the magnitude of an external magnetic field being used to make the magnetization directions of the two ferromagnetic thin films either parallel or anti-parallel, which changes the tunnel electrical current in the insulation film, thereby enabling the storage of data "1" or data "0".

FIG. 4(b) shows a write operation in an actual MRAM having the memory cells of FIG. 3 arranged in an array.

In the MRAM memory cells of the past, when writing data, write currents C1 and C2 are caused to flow in the selected word line (W112) and bit line (B152), respectively, and the magnetic fields induced in the area surrounding the interconnects (magnetic fields M1 and M2) and the combined magnetic field M12 are used to arrange the magnetic domains in the data storage layer within the memory cell in one direction.

To store information that is the opposite of the above, if the current direction of one of the selected word line (W112) and bit line (B152), for example, that of the bit line (B152) is reversed to the direction opposite that when information was stored as noted above, the direction of the magnetic field M2 can be changed by 180 degrees. Because as a result the combined magnetic field M12 is changed by 90 degrees, the direction of the magnetic domain in the data storage layer within the memory cell is forcibly reversed. In this manner, it is possible to establish the direction of the magnetic domain with respect to the direction of the magnetic domain of the fixed layer, in which the direction of the magnetic domain does not change by an external magnetic field.

In an MRAM memory cell of the past, when writing data, by causing a prescribed current to flow in the word line and bit line, the magnetic field induced in the area surrounding the interconnects is used to forcibly reverse the direction of the magnetic domain of the data storage layer in the memory cell, and a current of 10 mA to 20 mA (writing current) is usually required to make this forcible reversal of the direction of a magnetic domain.

In the technology for manufacturing semiconductor devices such as an MRAM, it is usual and common to use aluminum or copper for the word and bit lines, the electrical resistance of each material being approximately 100 mΩ/□ for aluminum and approximately 40 mΩ/□ for copper, respectively.

When using these materials, the potential drop in the interconnect by the writing current flowing therethrough is expressed for the case of a copper interconnect as follows.
40 mΩ/□×(10 mA to 20 mA)×interconnect length ratio In the above, the interconnect length ratio is the ratio of the interconnect length divided by the interconnect width. For example, in the case of an interconnect length ratio of 2000, the potential drop would be 40mΩ/□×(10 mA to 20 mA)×2000=0.8 to 1.6 V The above means that a maximum potential difference of 1.6 V will occur at both ends of the interconnects (word line and bit line). For example, if one end is at the ground potential, unless the reverse end is made 1.6 V, the above-noted write current will not flow.

A problem which arises in this case is described below, with reference to FIG. 5 of the accompanying drawings.

FIG. 5 is a schematic representation of a memory cell array in an MRAM.

In FIG. 5, W1 to Wm are word lines of the array, and B1 to Bn are bit lines of the array. C11 is a memory cell provided at the intersection point between the first word line (W1) and the first bit line (B1), and in the same manner Cmn represents a memory cell provided at the intersection point between the m-th word line (Wm) and the n-th bit line (Bn).

Vw11 to Vwm1 represent the potentials of 1st to m-th word lines at a position connected to the memory cells C11 to Cm1 along the first bit line (B1), and Vb11 to Vb1n represent the potentials of 1st to n-th bit lines at a position connected to the memory cells C11 to C1n along the first word line (W1).

The above potential difference between the bit line and word line is applied to each of the memory cells. For example, to the memory cell Cmn at the intersection point of the m-th word line and the n-th bit line, a potential difference of (Vbmn−Vwmn) is applied.

When performing writing, a potential difference described above is applied to each memory cell, and in the past, when a prescribed current was caused to flow in a selected bit line and word line, it was common to apply the ground potential to non-selected bit lines and word lines.

However, for example in the case in which the first word line (W1) and the first bit line (B1) are selected, with the other word lines and bit lines non-selected, a potential of (Vb12−Vw12) is applied to a non-selected memory cell C12 connected to a non-selected bit line (B2) and a selected word line (W1).

In such a case, a potential of a word line is approximately 1.6 V, and the bit line is non-selected so that a potential of the non-selected bit line is at ground potential, therefore there occurs a potential difference of approximately 1.6 V at the memory cell as noted above.

As shown in FIG. 3(a), an insulation film 13 of approximately 1.5 nm thickness is provided between the magnetization fixing layer 12 formed on the lower interconnect layer 11 and the data storage layer 14, the insulation withstand voltage thereof being approximately 1.2 V to 1.5 V.

Thus, as noted above, a potential difference of approximately 1.6 V is applied to non-selected memory cells, when data is written, accordingly a potential difference applied to the non-selected memory cell exceeds the insulation withstanding voltage thereof, this causing breakdown of the insulation film.

In the past, to avoid above-mentioned problem, a countermeasures such as providing an upper limit for the interconnect resistance, or limiting the scale of the memory array are taken, so that the applied voltage does not exceed the insulation withstand voltage.

However, as the memory capacity of an MRAM becomes large, the size of the memory array inevitably becomes large, making this problem more and more serious.

Another type of the MRAM is disclosed in Japanese Patent Publication (KOKAI) No. 10-247381 which enables a high speed operation specially in a reading process, however this publication does not solve the above-mentioned problem.

Accordingly, it is an object of the present invention to improve on the above-noted drawbacks in the prior art, specifically by providing a novel non-volatile memory device formed by magnetoresistive elements, which eliminates insulation breakdown in the magnetoresistive elements in the memory cells, and enables the achievement of a large-capacity memory array.

SUMMARY OF THE INVENTION

To achieve the above-noted object, the present invention adopts the following basic technical constitution.

Specifically, a first aspect of the present invention is a non-volatile memory device comprising: a plurality of row lines extending in a first direction, a plurality of column lines extending in a second direction differing from the first direction, the plurality of column lines and the plurality of row lines forming a wiring matrix, a plurality of memory cells disposed at intersection points between the plurality of row lines and the plurality of column lines of the wiring matrix, each memory cell being formed by two ferromagnetic thin films and an insulation film therebetween, a wiring selection means for selecting at least one row line from the plurality of row lines and selecting at least one column line from the plurality of column lines, and a potential applying means for causing a prescribed current to flow in the selected row lines and column lines and applying to the row lines and column lines other than the selected row lines and column lines a prescribed potential which is not a ground potential.

A second aspect of the present invention is a non-volatile memory device comprising: a plurality of row lines extending in a first direction, a plurality of column lines extending in a second direction differing from the first direction, the plurality of column lines and the plurality of row lines forming a wiring matrix, a plurality of memory cells disposed at intersection points between the plurality of row lines and the plurality of column lines of the wiring matrix, each memory cell being formed by two ferromagnetic thin films and an insulation film therebetween, a wiring selection means for selecting at least one row line from the plurality of row lines and selecting at least one column line from the plurality of column lines, and a potential applying means for causing a prescribed current to flow in the selected row lines and column lines and applying to the row lines and column lines other than the selected row lines and column lines a prescribed potential other than a ground potential and substantially not exceeding a voltage applied to a selected memory cell.

A third aspect of the present invention is a non-volatile memory device comprising: a plurality of row lines extending in a first direction, a plurality of column lines extending in a second direction differing from the first direction, the plurality of column lines and the plurality of row lines forming a wiring matrix, a plurality of memory cells disposed at intersection points between the plurality of row lines and the plurality of column lines of the wiring matrix, each memory cell being formed by two ferromagnetic thin films and an insulation film therebetween, a wiring selection means for selecting at least one row line from the plurality of row lines and selecting at least one column line from the plurality of column lines, and a potential applying means for causing a prescribed current to flow in the selected row lines and column lines and applying to the row lines and column lines other than the selected row lines and column lines a prescribed potential which is not a ground potential, and the prescribed potential not exceeding a maximum value and not lower than a minimum value of potential at end parts of the selected row lines and column lines.

In a fourth aspect of the present invention, the potential applying means further comprising a first power supply means for applying a first voltage to the non-selected row lines and a second power supply means for applying a second voltage differing from the first voltage to the non-selected column lines.

DETAILED DESCRIPTION OF THE PREFERRED EMBODIMENTS

Figure 1:
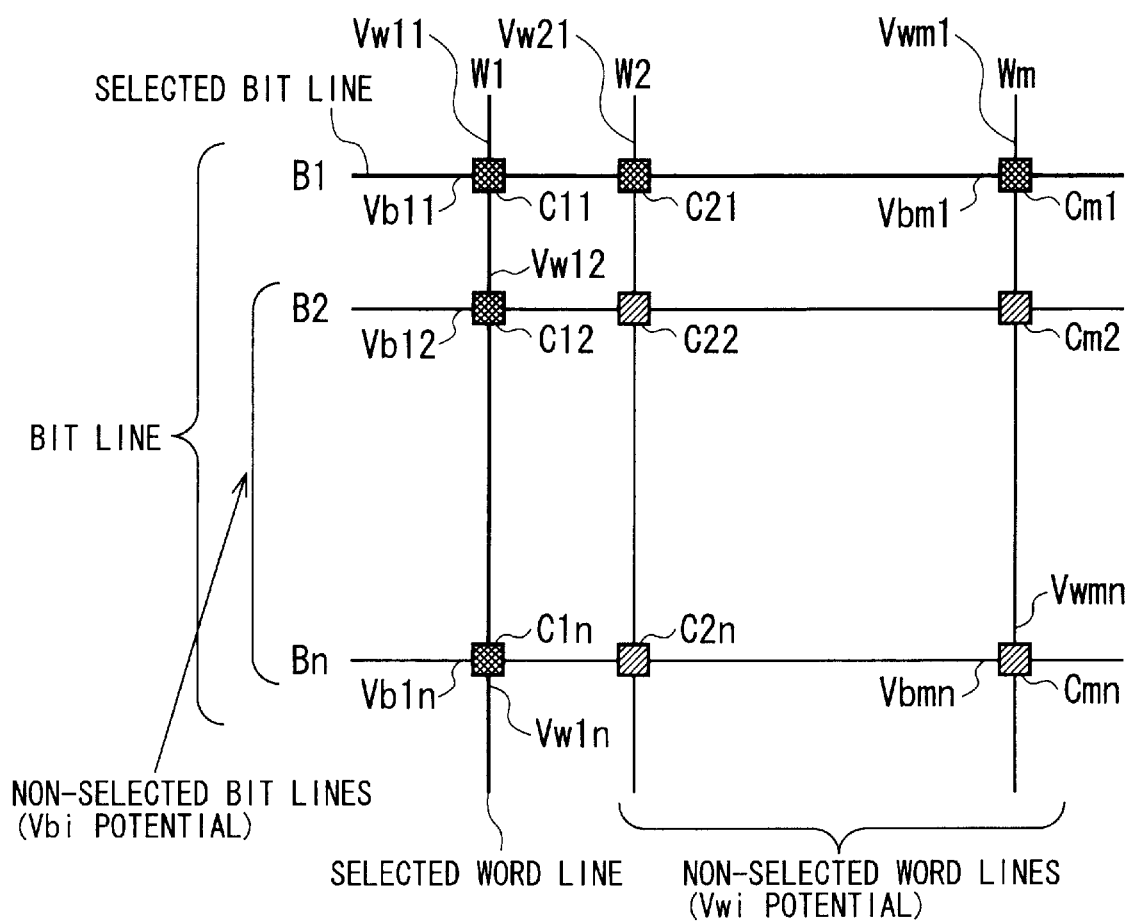
FIG. 1 is a schematic representation of an MRAM memory cell array showing an embodiment of the present invention.
Figure 2:
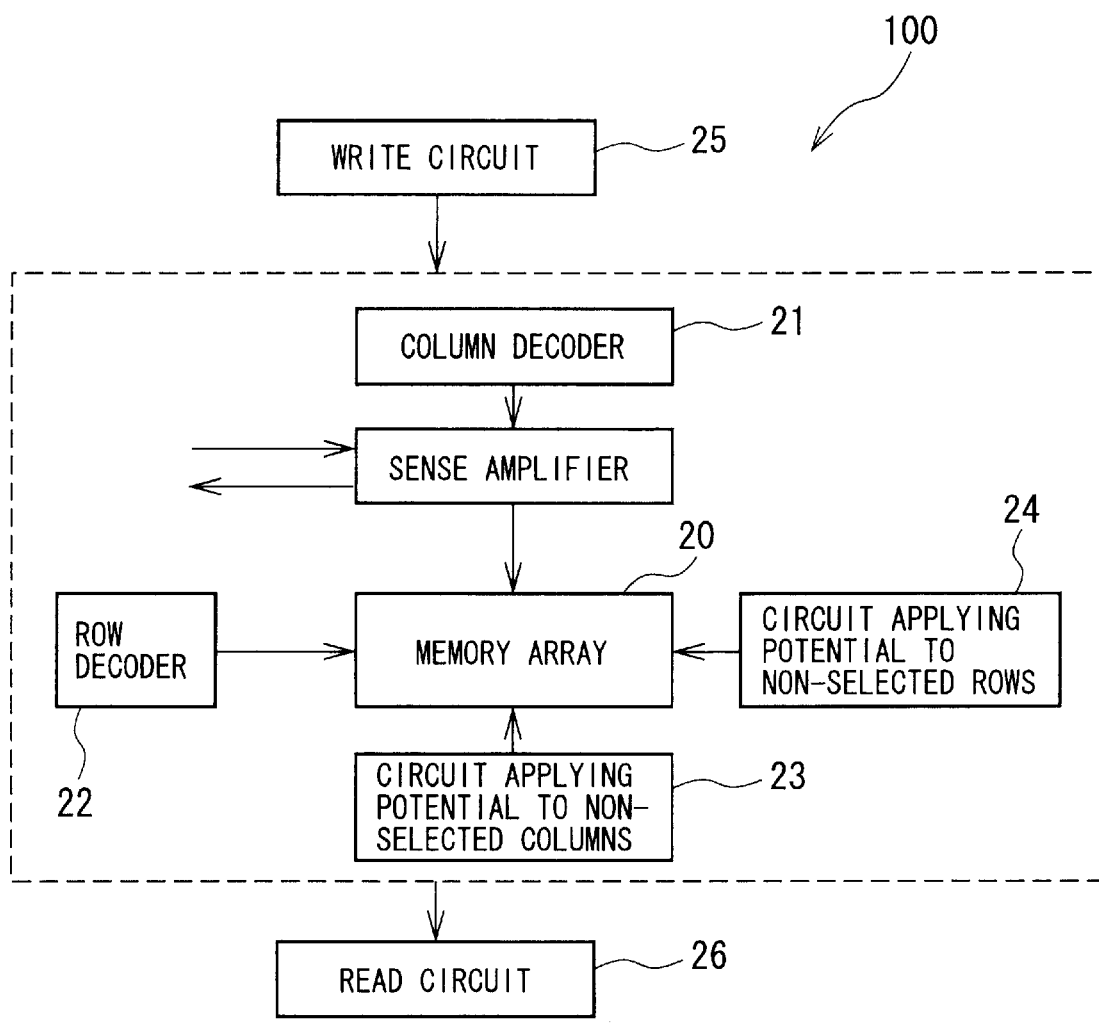
FIG. 2 is a block diagram of a non-volatile memory device according to the present invention.
Figure 3A:
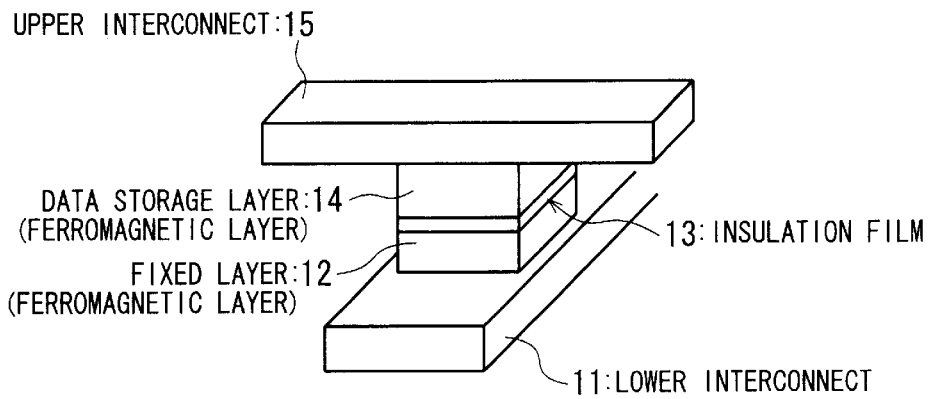
FIG. 3(a) is a drawing illustrating the structure of the conventional MRAM.
Figure 3B:
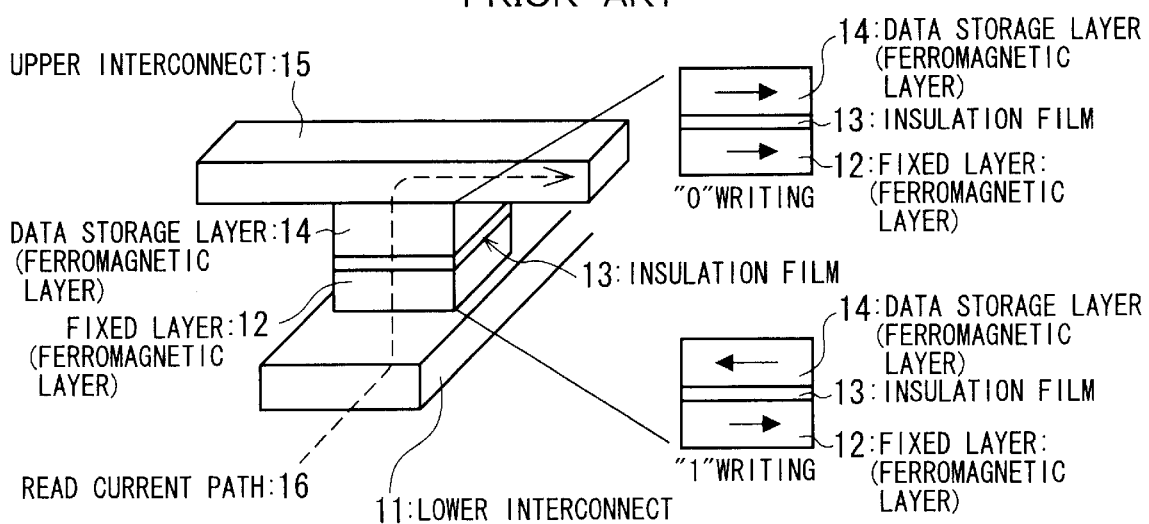
FIG. 3(b) is a drawing illustrating the operation of the conventional MRAM shown in FIG. 3(a).

Embodiments of a non-volatile memory device according to the present invention is described in detail below, with references made to relevant accompanying drawings.
First embodiment FIG. 1 shows an MRAM memory cell array of the first embodiment of the present invention, and FIG. 2 is a block diagram of a non-volatile memory device according to the present invention.

In the array shown in these drawings, W1 to Wm are word lines of the memory array, B1 to Bn are bit lines. C11 is a memory cell provided at the intersection of the first word line (W1) and the first bit line (B1), and similarly Cmn represents a memory cell provided at the intersection of the m-th word line (Wm) and the n-th bit line (Bn).

Vw11 to Vwm1 represent the respective potentials of the first to m-th word lines at positions connected to the memory cells C11 to Cm1 along the first bit line (B1), and Vb11 to Vb1n represent the respective potentials of the first to n-th bit line at positions connected to the memory cells C11 to C1n along the first word line (W1).

Figure 4A:
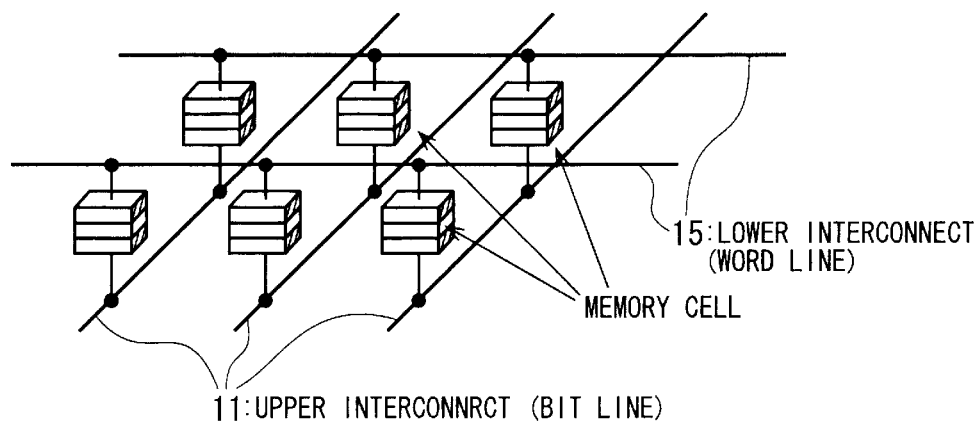
FIG. 4(a) is a drawing illustrating the structure of a memory cell array of the prior art. of the conventional MRAM.
Figure 4B:
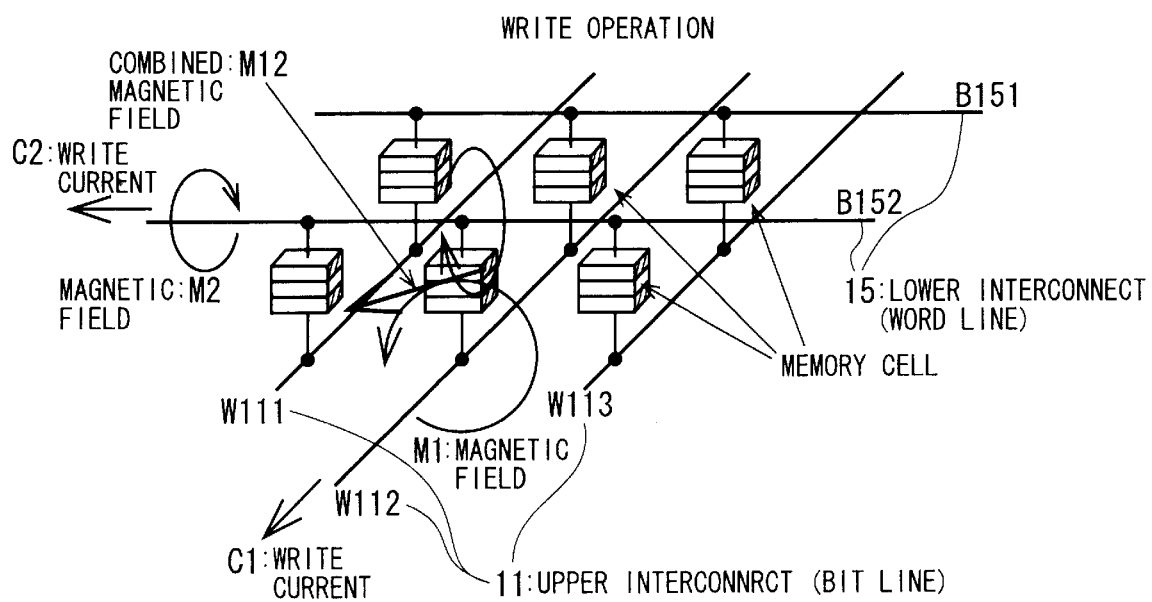
FIG. 4(b) is a drawing illustrating the writing operation of the conventional MRAM shown in FIG. 4(a).
Figure 5:
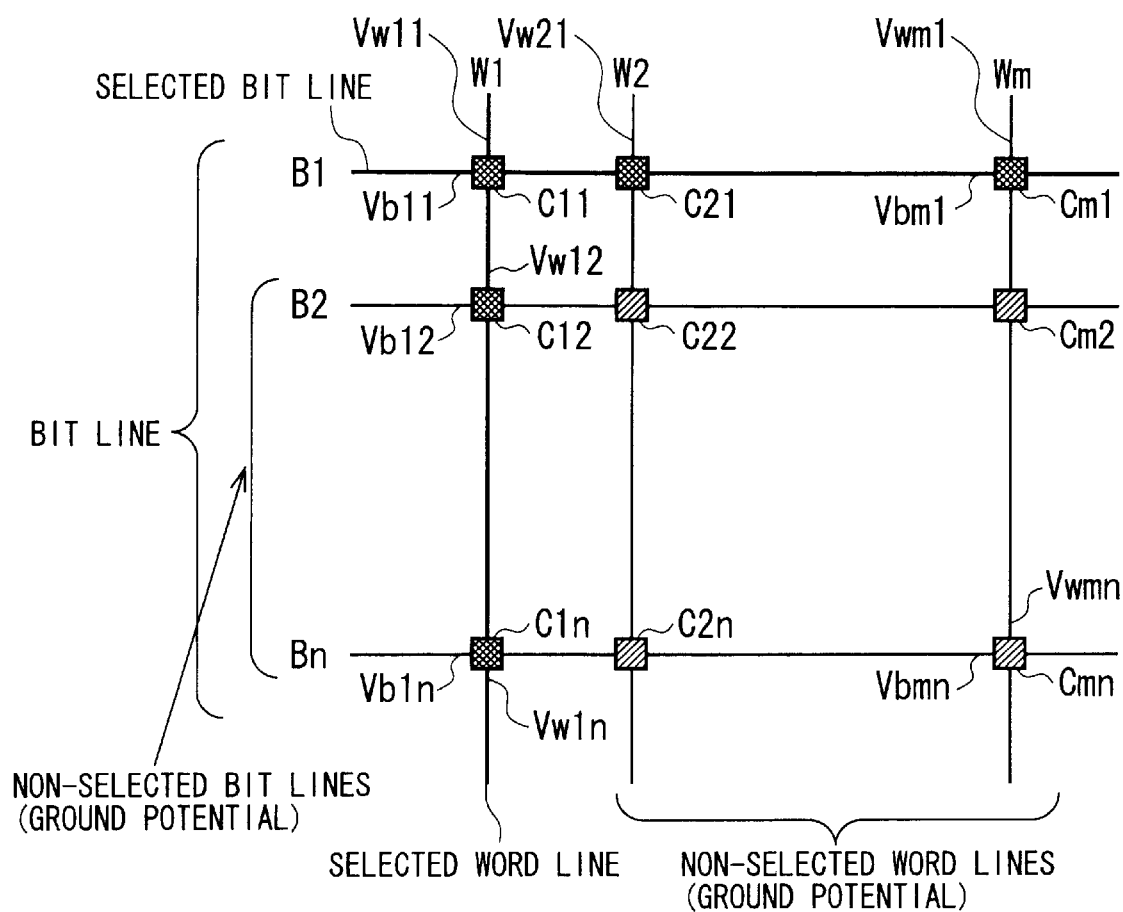
FIG. 5 is a drawing showing an MRAM memory cell array of the past.

Similar to the case shown in FIG. 4(b), in a MRAM memory cell according to the present invention as well, when writing data, prescribed currents are caused to flow in the selected word line (W112) and bit line (B152) (respectively write currents C1 and C2), and the magnetic fields induced in the area surrounding the interconnects (respectively, magnetic fields M1 and M2) and the combined magnetic field M12 are used to arrange the magnetizations of the magnetic domains of the data storage layer in the memory cell in the same direction.

Similarly, to store information that is the opposite of the above, if the current direction of either one of the selected word line (W112) and bit line (B152), for example, that of the bit line (B152) is reversed to the direction opposite that when information was stored as noted above, the direction of the magnetic field M2 can be changed by 180 degrees. In this case, as the combined magnetic field M12 is changed by 90 degrees, the direction of the magnetic domain in the data storage layer within the memory cell is forcibly reversed. In this manner, it is possible to establish the direction of the magnetic domain with respect to the direction of the magnetic domain of the fixed layer, in which the direction of the magnetic domain does not change by an external magnetic field (refer to FIG. 4(b)).

In FIG. 1, writing is being performed by using the word line (W1) and the bit line (B1) selected. All non-selected word lines W2 to Wm and all non-selected bit lines B2 to Bn remain unselected.

The write current in word line (W1) flows from the memory cell C11 toward C1n, and in the bit line B1 flows from the memory cell C11 toward Cm1. Therefore, the potential distributions in the word line (W1) and the bit line (B1) caused by the potential drop attributed to the write current is such that the potential decrease from the memory cell C11 toward C1n and from the memory cell C11 toward Cm1.

During a write operation in a non-volatile memory device according to the present invention, potential Vwi is applied to word lines other than the selected word line (i.e., to word lines W2 to Wm in FIG. 1), and potential Vbi is applied to bit lines other than the selected bit line (i.e., to bit lines B2 to Bn in FIG. 1).

(1) The non-selected word line potential Vwi, based on Vw1n<Vw11, is such that Vw1n<Vwi<Vw11.

(2) The non-selected bit line potential Vbi, based on Vbm1<Vb11, is such that Vbm1<Vbi<Vb11.

(3) The larger of (Vw11−Vwi) and (Vwi−Vw1n) is set to a value that does not exceed the insulation withstand voltage of the memory cell.

(4) The larger of (Vb11−Vbi) and (Vbi−Vbm1) is set to a value that does not exceed the insulation withstand voltage of the memory cell.

If this method is applied to an example of the past using, for example, copper interconnects, in which an interconnect length ratio is 2000 for both the word lines and the bit lines, the potential drop would be $$40 m\Omega/\square \times 20\ mA \times 2000 = 1.6\ V$$

Considering the above-noted (1) to (4), if both Vwi and Vbi are set to 0.8 V, the maximum voltage applied to the memory cell is 0.8 V (=1.6 V−0.8 V), enabling the achievement of a memory cell array having an interconnect length ratio of 2000 without exceeding the insulation withstand voltage of 1.2 V to 1.5 V.
Second embodiment A second embodiment of the present invention is described below.

In the above-described embodiment of the present invention, the example described was one in which the interconnect length ratios of the word lines and the bit lines were substantially the same. In this case, it is possible to set the potential Vwi of the non-selected word lines and the potential Vbi of the non-selected bit lines to the same value.

However, if the memory cell structure is such that the lengths in the word-line and bit-line differ each other, or if the configuration of the memory cell array is such that lengths in the word-line and bit-line differ, there are cases in which there is a great difference in interconnect length ratio between the word-line direction and the bit-line direction of the memory cell array.

In this case, it is possible to set the potential Vwi of the non-selected word lines and the potential Vbi of the non-selected bit lines independently.

In the second embodiment, the potential Vwi of non-selected word lines and the potential Vbi of non-selected bit lines are set independently, so that the number of different potentials applied to the memory cell array increases, compared with the first embodiment, as the result of that, there is a drawback in terms of increased complexity of the control circuit. However, there is an advantage in being able to accommodate memory cell arrays having diverse configurations.

As described in detail above, in the conventional MRAM, it was common to apply a ground potential to non-selected word lines and bit lines when performing writing. According to the present invention, a prescribed potential between the maximum and minimum potentials in the potential distribution of the interconnects is applied to the non-selected word lines and non-selected bit lines of the memory cell array. As a result, it is possible to lower the voltage applied to non-selected memory cells and an easing of the electrical field applied to the insulation film, making it possible to eliminate insulation breakdown in the memory cells.

Additionally, it is possible with the present invention to ease the past restrictions on the scale of the memory cell array, thereby enabling the achievement of a large-capacity MRAM.

What is claimed is:

1. A non-volatile memory device comprising:

a plurality of row lines extending in a first direction;

a plurality of column lines extending in a second direction differing from said first direction, said plurality of column lines and said plurality of row lines forming a wiring matrix;

a plurality of memory cells disposed at intersection points between said plurality of row lines and said plurality of column lines of said wiring matrix, each memory cell being formed by two ferromagnetic thin films and an insulation film there between;

a wiring selection means for selecting at least one row line from said plurality of row lines and selecting at least one column line from said plurality of column lines; and a potential applying means for causing a prescribed current to flow in said selected row lines and column lines and applying to said row lines and column lines other than said selected row lines and column lines a prescribed potential, wherein in a memory cell disposed at the intersection of a selected row line and an unselected column line a voltage drop from said selected row line to said unselected column line is not equal to a ground potential, or wherein in a memory cell disposed at the intersection of an unselected row line and a selected column line a voltage drop from said unselected row line to said selected column line is not equal to a ground potential.

2. A non-volatile memory device comprising:

a plurality of row lines extending in a first direction;

a plurality of column lines extending in a second direction differing from said first direction, said plurality of column lines and said plurality of row lines forming a wiring matrix;

a plurality of memory cells disposed at intersection points between said plurality of row lines and said plurality of column lines of said wiring matrix, each memory cell being formed by two ferromagnetic thin films and an insulation film there between;

a wiring selection means for selecting at least one row line from said plurality of row lines and selecting at least one column line from said plurality of column lines; and a potential applying means for causing a prescribed current to flow in said selected row lines and column lines and applying to said row lines and column lines other than said selected row lines and column lines a prescribed potential other than a ground potential and substantially not exceeding a voltage applied to said selected row lines and column lines.

3. A non-volatile memory device comprising:

a plurality of row lines extending in a first direction;

a plurality of column lines extending in a second direction differing from said first direction, said plurality of column lines and said plurality of row lines forming a wiring matrix;

a plurality of memory cells disposed at intersection points between said plurality of row lines and said plurality of column lines of said wiring matrix, each memory cell being formed by two ferromagnetic thin films and an insulation film there between;

a wiring selection means for selecting at least one row line from said plurality of row lines and selecting at least one column line from said plurality of column lines; and a potential applying means for causing a prescribed current to flow in said selected row lines and column lines and applying to said row lines and column lines other than said selected row lines and column lines a prescribed potential which is not a ground potential, and said prescribed potential not exceeding a maximum value and not lower than a minimum value of potential at end parts of said selected row lines and column lines.

4. A non-volatile memory device according to claim 1, wherein said potential applying means further comprising a first power supply means for applying a first voltage to said non-selected row lines and a second power supply means for applying a second voltage differing from said first voltage to said non-selected column lines.

* * * * *